(12) United States Patent
Sato et al.

(10) Patent No.: US 6,388,857 B1
(45) Date of Patent: *May 14, 2002

(54) SEMICONDUCTOR CIRCUIT DEVICE WITH IMPROVED SURGE RESISTANCE

(75) Inventors: Hirotoshi Sato; Shigeki Ohbayashi, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/359,124

(22) Filed: Jul. 23, 1999

(51) Int. Cl.$^7$ .............................. H02H 3/22; H01R 9/00; H05K 5/00

(52) U.S. Cl. ........................ 361/111; 361/760; 361/772

(58) Field of Search ................................ 361/760, 772, 361/54, 56, 111; 257/678, 690, 691, 692

(56) References Cited

U.S. PATENT DOCUMENTS

| 4,819,047 A | * | 4/1989 | Gilfeather et al. | 257/357 |
|---|---|---|---|---|
| 5,610,791 A | * | 3/1997 | Voldman | 361/56 |
| 5,945,713 A | * | 8/1999 | Voldman | 257/355 |
| 5,986,863 A | * | 11/1999 | Oh | 361/56 |
| 5,991,134 A | * | 11/1999 | Tan et al. | 361/56 |
| 6,104,588 A | * | 8/2000 | Hariton et al. | 361/111 |

FOREIGN PATENT DOCUMENTS

| JP | 55-128859 | 10/1980 | |
|---|---|---|---|
| JP | 61-23356 | 1/1986 | |
| JP | 5-55481 | 3/1993 | |
| JP | 5-335485 | 12/1993 | |
| JP | 6-85176 | 3/1994 | |
| JP | 7-29972 | 1/1995 | |
| JP | 8-111508 | 4/1996 | |
| JP | 9-64276 | 3/1997 | |
| JP | 10-23662 | 1/1998 | |
| JP | 10-209377 | 8/1998 | |
| JP | 02000304807 A | * 11/2000 | ........... G01R/31/26 |

* cited by examiner

Primary Examiner—Kim Huynh
(74) Attorney, Agent, or Firm—McDermott, Will & Emery

(57) ABSTRACT

Inter power supply surge voltage transmitting diode element is formed by a buried layer formed in a semiconductor substrate, a well region formed on the buried layer with its bottom portion being in contact with the buried layer, and impurity regions of mutually different conductivity types formed apart from each other at the surface of the well region. One of the impurity regions is electrically coupled to a first power supply line on which a surge voltage generates, and the other is electrically coupled to a second power supply line absorbing the surge voltage. The surge transmitting element includes a plurality of elements arranged parallel to each other between the first and second power supply lines. The second power supply line supplies the power supply voltage to an internal circuitry which consumes relatively small current.

13 Claims, 9 Drawing Sheets

SEMICONDUCTOR CIRCUIT DEVICE WITH IMPROVED SURGE RESISTANCE

BACKGROUND OF THE INVENTION

1. Field of the Invention

The present invention relates to a semiconductor circuit device and, more particularly, to a semiconductor circuit device having an input protection circuit protecting an input circuit against a surge voltage such as static electricity applied to an input pad. More specifically, the present invention relates to a structure for improving surge resistance of a multi-power source semiconductor circuit device to which a plurality of power supply voltages are applied externally.

2. Description of the Background Art

FIG. 1 schematically shows a configuration of an signal input portion of a conventional semiconductor circuit device. Referring to FIG. 1, the conventional semiconductor circuit device includes an input circuit 2 receiving a signal applied to input pad 1 and generating an internal signal, and an internal circuit 3 performing a prescribed process in accordance with the internal signal applied from input circuit 2. Input circuit 2 operates using a power supply voltage Vddi on a power supply node PS1 and the ground voltage GND as two operational power source voltages, and converts an amplitude of the input signal applied to input pad 1 to the level of the power supply voltage Vddi. Internal circuit 3 operates using a power supply voltage Vdd on a power supply node PS2 and the ground voltage GND as two operational power source voltages.

The semiconductor circuit device further includes a diode type input protection circuit 2 for protecting input circuit 2 against a surge voltage applied to input pad 1. Diode type input protection circuit 4 includes a PN junction diode D1 connected in the forward direction between an internal node 5 and a power supply node PS3, and a PN junction diode D2 connected in reverse direction between internal node 5 and the ground node. Power supply node PS3 of diode type input protection circuit 4 and power supply node PS1 of input circuit 2 are connected to each other through a power supply line G. A parasitic capacitance Cl is parasitically connected to power supply line 6, and there is a parasitic capacitance C2 on a power supply line 7 connected to power supply node PS2. Power supply lines 6 and 7 are separated from each other. When an input signal having relatively small amplitude such as an LVTTL (low voltage transistor-transistor-logic) is used as an input signal, power supply voltage Vddi for the input circuit is set at a value lower with respect to the power supply voltage Vdd of the internal circuitry. When the power supply voltage Vdd is 3.3 V, LVTTL has input high level voltage VIH of 2.0 V and an input low level voltage VIL of 0.8 V. In order to accurately determine the H and L levels of such a signal having small amplitude, the voltage level of power supply voltage Vddi of input circuit 2 is made lower than the power supply voltage Vdd of the internal circuitry.

Input circuit 2 is an input buffer circuit connected to input pad 1, of which total number is relatively small, and hence capacitance value of parasitic capacitance C1 connected to power supply line 6 is relatively small. In contrast, internal circuit 3 connected to power supply line 7 has a number of components, and capacitance value of parasitic capacitance C2 connected to internal power supply line 7 is relatively large.

Assume that a positive surge voltage is applied to input pad 1. The positive surge voltage is at a voltage level sufficiently higher than power supply voltage Vddi, so that diode D1 is rendered conductive and the surge voltage is transmitted from power supply node PS3 through power supply line 6 and power supply node PS1 to input circuit 2. The surge voltage is dissipated and consumed by the components included in input circuit 2, and the surge voltage is absorbed.

When the surge voltage is to be absorbed by power supply line 6, however, the surge voltage cannot entirely be absorbed by parasitic capacitance C1 as the capacitance value of parasitic capacitance C1 connected to power supply line 6 is small, and a high surge voltage is undesirably applied to the components of input circuit 2, damaging the components (transistors) included in input circuit 2.

Similarly, when a negative surge voltage generates on input pad 1, diode D2 is rendered conductive, and the negative surge voltage is absorbed by the ground line through the ground node of diode type input protection circuit 4. When the ground node of diode type input protection circuit 4 and the ground node of input circuit 2 are connected to each other by the ground line, the negative surge voltage cannot sufficiently be absorbed as the parasitic capacitance of the ground line is also small, and therefore, components of input circuit 2 are damaged by the negative surge voltage.

Therefore, even when input protection circuit 4 is provided, the surge voltage cannot effectively be absorbed, and hence input circuit 2 cannot sufficiently be protected against the surge voltage.

FIG. 2 shows another configuration of the conventional input protection circuit. In the configuration shown in FIG. 2, a PN junction diode D3 is connected in the forward direction between power supply line 6 of input circuit 2 and power supply line 7 of internal circuit 3. In the configuration shown in FIG. 2, when a positive surge voltage is applied, diode D1 is rendered conductive and the surge voltage is transmitted to power supply line 6. When the surge voltage cannot sufficiently be absorbed by parasitic capacitance C1, diode D3 is rendered conductive, the surge voltage is transmitted from power supply line 6 to power supply line 7, and the surge voltage is absorbed by parasitic capacitance C2 existing on power supply line 7. As internal circuit 3 has a number of components and parasitic capacitance C2 has large capacitance value, the surge voltage can be absorbed without damaging the components of internal circuit 3.

By connecting separately provided power supply lines 6 and 7 utilizing diode D3, absorbing path of the positive surge voltage is ensured, improving surge resistance. By providing similar configuration, a negative surge voltage absorbing path can also be formed for the negative surge voltage.

FIG. 3 is a schematic diagram representing a cross sectional structure of PN junction diode D3 shown in FIG. 2. Referring to FIG. 3, PN junction diode D3 includes an N well 11 formed at a surface of a P type semiconductor substrate 10, a high concentration P type impurity region 12 formed at a surface of N well 11, and a high concentration N type impurity region 13 formed spaced from impurity region 12 at the surface of N well 11.

Diode D3 utilizes a PN junction formed between P type impurity region 12 and N well 11. P type impurity region 12 is connected to power supply node PS1 applying power supply voltage Vddi, and impurity region 13 is connected to power supply node PS2 applying power supply voltage Vdd. N well 11 has low impurity concentration and relatively high resistance. The PN junction between P type impurity region 12 and the N well is connected in series with a well resistance R of N well 11. When the surge voltage is transmitted from input pad 1 through diode D1 and power supply line 6 to diode D3, it is necessary to transmit the surge voltage at high speed to power supply node PS2 using diode D3, so that the surge voltage is absorbed at high speed by parasitic capacitance C2 of power supply line 7 connected to power supply node PS2.

However, as well resistance R has high resistance value, the surge voltage cannot fully be transmitted from power supply node PS1 to power supply node PS2 (as there is a considerable voltage drop caused by well resistance R), and therefore the voltage level of the surge voltage at power supply node PS1 cannot sufficiently be lowered. Therefore, there is a case that a large surge voltage is applied to input circuit 2 connected to power supply node PS2, damaging input circuit 2.

In order to eliminate the disadvantageous effect of well resistance R and to transmit the large surge voltage from power supply node PS1 to power supply node PS2 at high speed, it is necessary to enlarge the size (width) of diode D3 so as to lower the equivalent resistance value of well resistance R from power supply node PS1 to power supply node PS2. In that case, the size of PN junction diode D3 increases, and the area occupied by diode D3 increases. Further, when internal power supply lines 6 and 7 are not adjacent to each other and not parallel to each other, it is necessary to connect PN junction diode D3 between power supply lines 6 and 7 by using a lead line. Therefore, unless there is sufficient free area, layout of diode D3 with margin is difficult, which means that it is difficult to implement a surge voltage resistant circuit suitable for higher degree of integration.

SUMMARY OF THE INVENTION

An object of the present invention is to provide a semiconductor circuit device allowing improvement of surge resistance without increasing occupation area.

Another object of the present invention is to provide a semiconductor circuit device free of any restriction in position of laying-out a diode element for transmitting inter power supply surge voltage.

A further object of the present invention is to provide a multi-power source semiconductor circuit device in which the surge voltage is surely absorbed.

According to a first aspect, the present invention provides a semiconductor circuit device including a surge resistance enhancing element coupled between first and second power source lines and transmitting the surge voltage generated on the first power source line to the second power source line. The surge resistance enhancing element includes a buried layer of a second conductivity type formed in a substrate region of a first conductivity type, and a well of the second conductivity type formed at the surface of the buried layer. The bottom portion of the well is in contact with the surface of the buried layer.

The semiconductor circuit device in accordance with the first aspect further includes a first impurity region of the first conductivity type formed at the surface of the well and electrically connected to the first power source line, and a second impurity region of the second conductivity type formed apart from the first impurity region at the well surface and electrically connected to the second power source line.

According to a second aspect, the present invention provides a semiconductor circuit device including a first power source line formed extending continuously in the shape of a loop along the periphery of a rectangular region of the semiconductor substrate and transmitting a first power source voltage, an input circuit coupled to the first power source line and generating an internal signal in accordance with a signal applied to an input node, a second power source line formed extending in the shape of a loop along the periphery of the rectangular region of the semiconductor substrate and transmitting a second power source voltage, and a plurality of diode elements coupled parallel to each other between the first and second power source lines.

According to a third aspect, the present invention provides a semiconductor circuit device including a first power source line transmitting a first power source voltage, a second power source line provided separate from the first power source line and transmitting a second power source voltage, a third power source line provided separate from the first power source line and transmitting a third power source voltage, an input circuit operating using the first power source voltage of the first power source line as one operational power supply voltage and generating an internal signal in accordance with a signal applied to an input node, first internal circuitry receiving as one operational power source voltage the second power source voltage on the second power source line and performing a prescribed internal operation, and second internal circuitry receiving as one operational power supply voltage, the third power source voltage on the third power source line and performing a prescribed operation. In operation, the second internal circuitry consumes more current than the first internal circuitry in operation.

The semiconductor circuit device in accordance with the third aspect of the present invention further includes a diode element coupled between the first and second power source lines.

As the surge resistance enhancement element for transmitting the surge voltage between power source lines is formed in the well region and the buried layer, the buried layer reduces equivalently the well resistance, and reduces serial parasitic resistance of the PN junction diode element, so that the surge voltage can be transmitted at high speed from the first to the second power source line, and hence the surge voltage can efficiently be absorbed.

Further, as the first and second power source lines are arranged along the periphery of the rectangular region of the semiconductor substrate in the shape of loops and the diode element for transmitting surge voltage is arranged between the first and second power source lines, the first and second power source lines are arranged parallel to each other over a long distance, and it becomes possible to arrange the diode element to be overlapping on the first and second power source lines, which facilitates layout and allows increase in size (width of the diode element. Therefore, the surge voltage can be transmitted efficiently.

Further, as a plurality of diode elements are provided, it is possible to efficiently transmit the surge voltage from the first power source line to the second power source line regardless of the position where the surge voltage generates. Therefore, the surge voltage resistance becomes less dependent on locations.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 4:
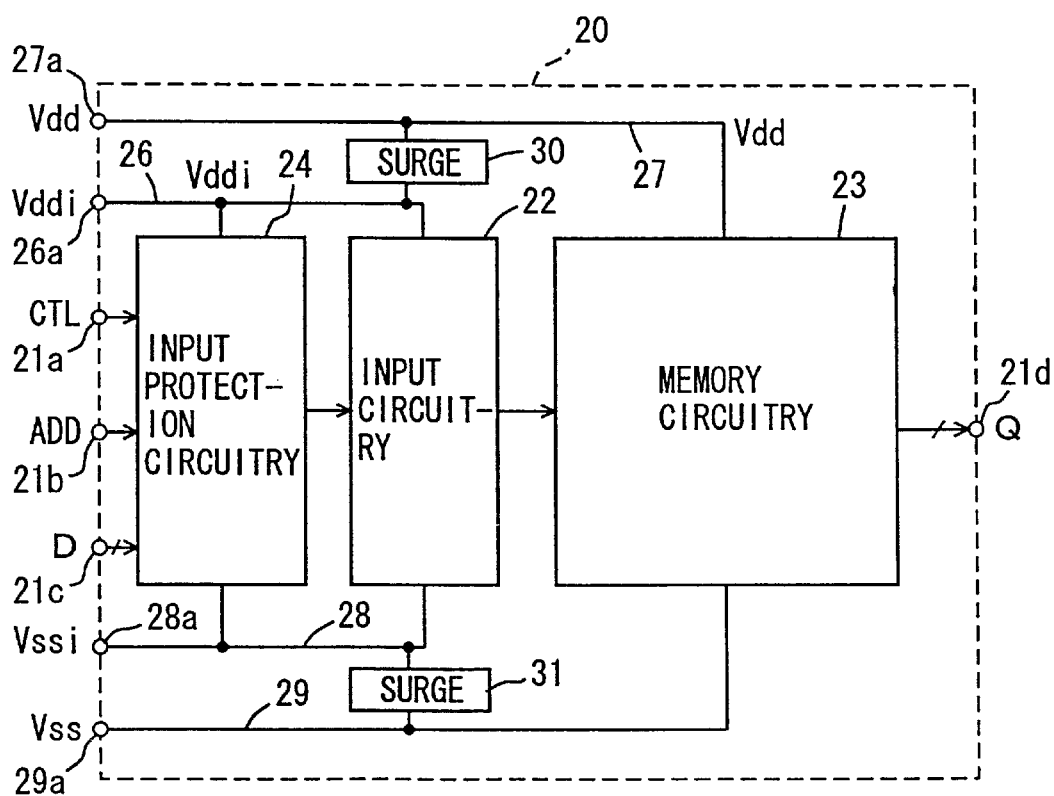
FIG. 4 is a schematic diagram representing an overall configuration of the semiconductor circuit in accordance with the present invention.

FIG. 4 is a schematic diagram representing an overall configuration of the semiconductor circuit device in accordance with the present invention. Referring to FIG. 4, a semiconductor circuit device 20 includes: input circuitry 22 receiving a power supply voltage Vddi applied to a pad 26a through a power supply line 26 and receiving a ground voltage Vssi at pad 28a through a low potential power supply line (hereinafter referred to as a ground line) 28 and generating internal signals in accordance with control signals CTL applied to pads 21a, address signals ADD applied to pads 21b and input data D applied to pad 21b; an input protection circuit 24 provided at a preceding stage of input circuit 24 for protecting input circuitry 22 against surge voltages generated in pads 21a, 2b and 21c; and a memory circuitry 23 operating in accordance with the internal signal applied from input circuitry 22. Memory circuitry 23 includes memory cells for storing data and a peripheral circuit for selecting a memory cell and writing/reading data.

Input protection circuit 24 includes input protection circuits provided for respective pads of pad groups 21a, 21b and 21c, and the input protection circuits are coupled to power supply line 26 and ground line 28. Memory circuitry 23 receives the power supply voltage Vdd applied to pad 27a through power supply line 27, and the ground voltage Vss applied to pad 27a through a ground line 29.

Control signals CTL applied to pads 21a include a chip selection signal for setting a chip to a selected state, a write enable signal for activating data write operation, an output enable; signal for activating data output operation, and an address strobe signal designating taking of an address signal. If the semiconductor circuit device operates in synchronization with a clock signal, the control signals CTL also include a clock signal CLK providing the timing of synchronized operation. Input circuitry 22 receives the control signals CTL, an address signal ADD and input data D, and converts these to signals having the amplitude of internal power supply voltage Vddi.

Semiconductor circuit device 20 further includes a surge resistance enhancing element 30 provided between power supply lines 26 and 27 and a surge resistance enhancing element 31 provided between ground lines 28 and 29.

In the semiconductor circuit device shown in FIG. 4, a data input pad 21c and a data output pad 21d are provided separately. Data input/output, however, may be performed through the same pad. In FIG. 4, data input pad 21c and data output pad 21d are shown arranged separately, simply for the purpose of distinguishing an input signal from an output signal.

Figure 5:
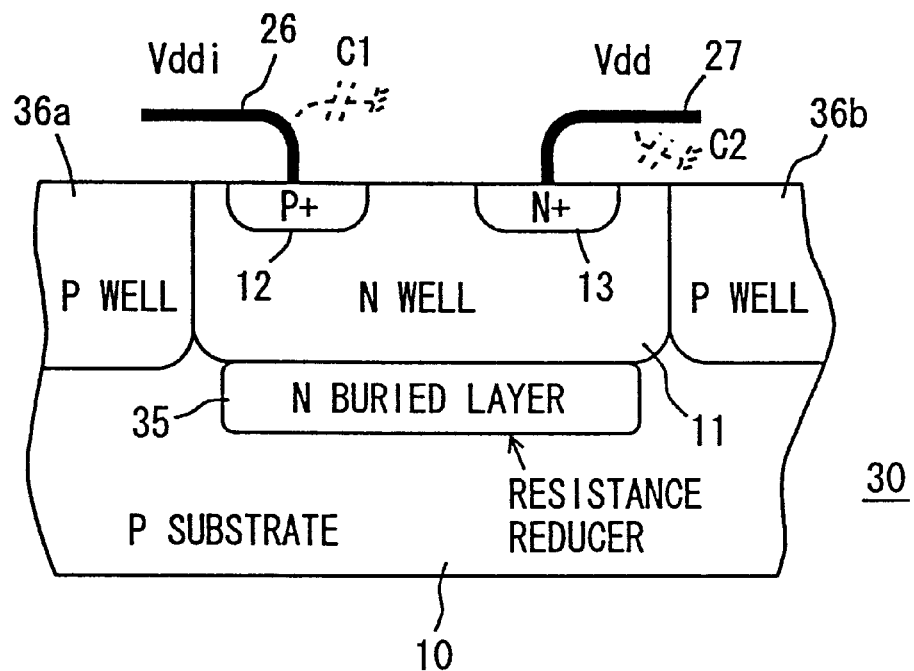
FIG. 5 is a schematic diagram representing a cross sectional structure of the surge resistance enhancing element in accordance with the first embodiment of the present invention.

FIG. 5 is a schematic diagram representing a cross sectional structure of surge resistance enhancing element 30 of FIG. 4. Referring to FIG. 5, surge resistance enhancing element 30 includes an N type buried layer 35 formed at the surface of P type semiconductor substrate 10, an N well 11 formed on N type buried layer 35, a high concentration P type impurity region 12 formed at the surface of N well 11 and electrically connected to power supply line 26, and a high concentration N type impurity region 13 formed at the surface of N well 11 apart from impurity region 12 and electrically connected to power supply line 27.

N type buried layer 35 has higher impurity concentration than N well 11 and sufficiently low resistance value. The bottom portion of N well 11 is in contact with the surface of N type buried layer 35. Therefore, at a portion of N well 11 in contact with N type buried layer 35, the voltage is the same, there is no voltage distribution (voltage drop) at the bottom portion of N well 11, therefore in N well 11, resistance value from a portion below impurity region 12 to a portion below N type impurity region 13 is reduced, and as a result, well resistance of N well 11 is reduced. P wells 36a and 36b are formed at opposing sides of N well 11.

P wells 36a and 36b are adapted to have higher impurity concentration than P type substrate 10.

In the structure of surge resistance enhancing element 30 shown in FIG. 5, PN junction between P type impurity region 12 and N well 11 is utilized as a PN junction diode. The resistance of N well 11 is equivalently lowered by N type buried layer 35. Therefore, even when the positive surge voltage is transmitted over power supply line 26, the surge voltage can be transmitted at high speed to power supply line 27, and the surge voltage on power supply line 26 is absorbed. Large parasitic capacitance C2 derived from components of memory circuitry 23 is connected to power supply line 27. Therefore, by the parasitic capacitance C2 or by the consumption by components in memory circuitry 23, the surge voltage can surely be absorbed. Further, P wells 36a and 36b formed at opposite sides of N well 11 provide parasitic PN junction capacitances. Therefore, the surge voltage is also absorbed by the parasitic PN junction capacitances.

By utilizing the N type buried layer 35, the resistance value of the PN junction serial parasitic resistance of surge resistance enhancing element can be made sufficiently small, and therefore even when the surge voltage on power supply line 26 cannot be absorbed by parasitic capacitance C1 of power supply line 26, the surge voltage can surely be transmitted to power supply line 27 and absorbed by parasitic capacitance C2.

Even when N type buried layer 35 attains to a high voltage level because of the positive surge voltage, the N type buried layer 35 and P type semiconductor substrate 10 are maintained in a reverse biased state provided that P semiconductor substrate 10 is biased to the level of the ground voltage. Therefore, no current flows between N type buried layer 35 and P type semiconductor substrate 10.

Figure 6:
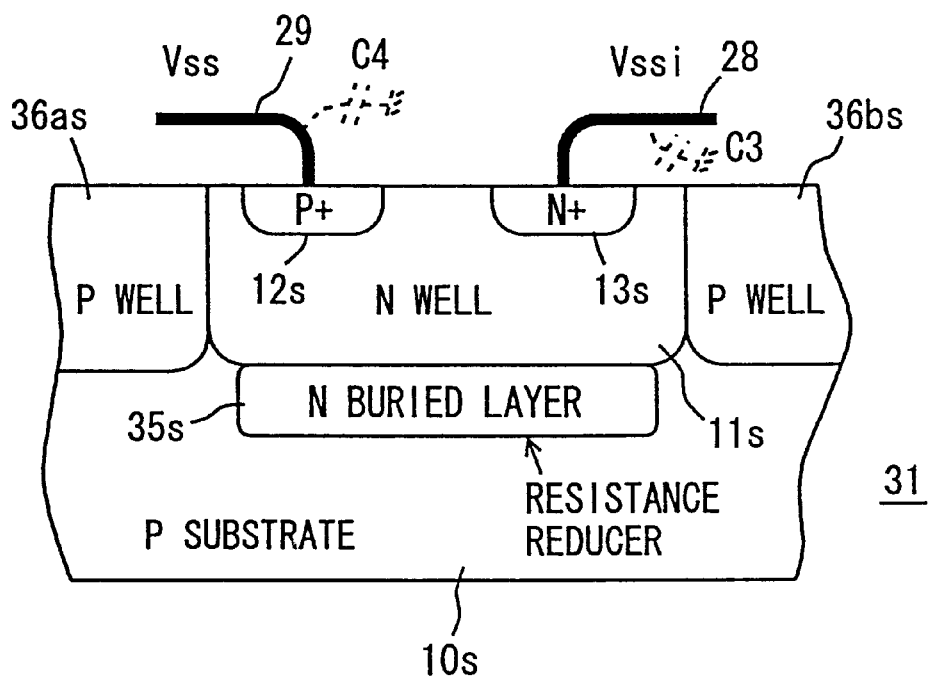
FIG. 6 is a schematic diagram representing a cross sectional structure of a negative surge resistance enhancing element in accordance with the first embodiment of the present invention.

FIG. 6 is a schematic diagram representing a cross sectional structure of surge resistance enhancing element 31 of FIG. 4. The cross sectional structure of surge resistance enhancing element 31 of FIG. 6 is the same as the cross sectional structure of surge resistance enhancing element 30 of FIG. 5. Therefore, corresponding portions are denoted by the same reference characters with "s" added as a suffix.

In the structure of surge resistance enhancing element 31 shown in FIG. 6, N type impurity region 13s is electrically coupled to ground line 28 transmitting ground voltage Vssi, and P type imply region 12s is coupled to ground line 29 transmitting ground voltage Vss. Capacitance value of parasitic capacitance C3 associated with ground line 28 is smaller than the capacitance value of parasitic capacitance C4 associated with ground line 29. When a negative surge voltage generates on ground line 28, P type impurity region 12s and N well 11s are biased in the forward direction, surge resistance enhancing element 31 is rendered conductive, and if the negative surge voltage is not absorbed by capacitance element C3, the surge voltage is transmitted to ground line 29 and absorbed by parasitic capacitance C4. At this time, as N type buried layer 35s has low resistance, the negative surge voltage can be transmitted at high speed to ground line 29 without causing any voltage drop (rise). Therefore, damage to the internal circuitry can be prevented.

Further, when the negative surge voltage is generated, N type buried layer 35s and P type semiconductor substrate 10s are biased in the forward direction, current flows from P type semiconductor substrate 10s to N type buried layer 35s and, similarly, the negative surge voltage is absorbed.

Figure 7:
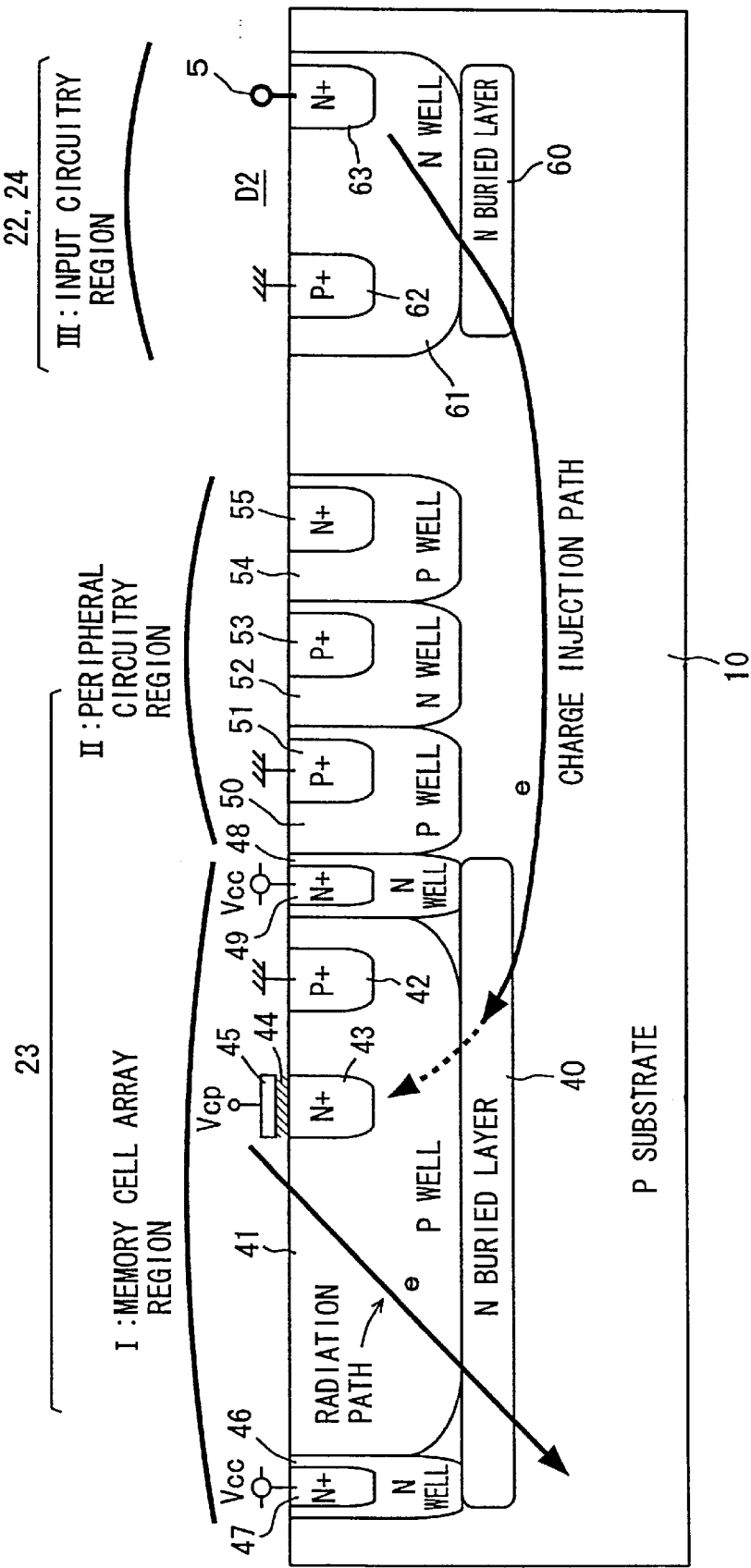
FIG. 7 is a schematic diagram representing a cross sectional structure of a main portion of the semiconductor circuit device in accordance with the present invention.

FIG. 7 is a schematic diagram representing a configuration of memory circuitry 23 and a signal input portion shown in FIG. 4. Referring to FIG. 7, memory circuitry 23 includes a memory cell array region I in which memory cells are arranged, and peripheral circuitry region II in which peripheral circuitry for controlling an access operation to a memory cell of the memory cell array is arranged. Input protection circuit 24 and input circuitry 22 are arranged in an input circuitry region III.

Memory cell array region I includes a high concentration N type buried layer 40 formed at the surface of P type semiconductor substrate 10, and a P well 41 formed on N type buried layer 40. Bottom portion of P well 41 is in contact with the surface of N type buried layer 40. P well 41 acts as a substrate region of a memory cell (a dynamic memory cell of 1 transistor/1 capacitor type). P well 41 is biased to the ground voltage through a high concentration P type impurity region 42 formed at the surface thereof.

The memory cell includes a high concentration N type imply region 43 formed at the surface of P well 41, and a cell plate electrode layer 45 formed on high concentration N type impurity region 43 with a capacitor insulating film 44 interposed. A prescribed cell plate voltage Vcp is applied to cell plate electrode layer 45. Cell plate electrode layer 45, capacitor insulating film 44 and impurity region 43 form a memory cell capacitor for storing information. An access transistor for selecting the memory cell capacitor is similarly formed by an n channel MOS transistor having N type impurity regions 43 as its drain/source formed at the surface of P well 41. The access transistor, however, is not shown for simplicity of the drawing.

Around P well 41, isolation N wells 46 and 48 are formed. N wells 46 and 48 have their bottom portions in contact with n type buried layer 40. N wells 46 and 48 are biased to the power supply voltage Vcc by high concentration N type impurity regions 47 and 49 formed at respective surfaces. Through N wells 46 and 48, N type buried layer 40 is also biased to the level of the power supply voltage Vcc. P well 41 is biased to the ground voltage level, and P well 41, N wells 46 and 48 and N type buried layer 40 are maintained in a reverse biased state. As P well 41 is biased to the level of the ground voltage, threshold voltages of MOS transistors such as the access transistor formed in memory cell array region I are stabilized and fluctuation of substrate potential caused by substrate current at the time of circuit operation is suppressed.

In peripheral circuitry region II, an N well 52 for forming a p channel MOS transistor and a P well 54 for forming an n channel MOS transistor are formed. In FIG. 7, a high concentration P type impurity region 53 formed at the surface of N well 52 for forming the p channel MOS transistor and a high concentration N type impurity region 55 formed at the surface of P well 54 for forming the n channel MOS transistor are shown as representatives. N wells 52 and 48 are isolated by a P well 50 formed therebetween. P well 50 is biased to the level of the ground voltage by a high concentration P type impurity region 51 formed at the surface thereof.

In the peripheral circuitry region II, the n channel MOS transistor and p channel MOS transistor may be formed by adopting a twin well structure in which a P well is formed in an N well or vice versa, or adopting a triple well structure in which an additional well is formed. FIG. 7 simply represents that a CMOS transistor is used in memory circuitry 23.

Input circuitry region III includes, as already stated, input protection circuit 24 and input circuitry 22. FIG. 7 shows a structure of diode D2 for absorbing the negative surge voltage included in input protection circuit 24 as a representative. In input circuitry region III, surge absorbing diode D2 is formed by a high concentration N type buried layer 60 formed in P type substrate 10, an N well 61 formed on N type buried layer 60, a high concentration P type impurity region 62 formed at the surface of N well 61 and a high concentration N type impurity region 63 formed at the surface of N well 61 spaced from P type impurity region 62.

P type impurity region 62 is coupled to the ground node, and N type impurity region 63 is electrically connected to input node 5. As N type buried layer 60 is utilized for the surge voltage absorbing diode D2 as in the inter power supply surge voltage transmitting diode, well resistance of N well 61 is equivalently reduced, and the negative surge voltage is transmitted at high speed to the ground node.

When the negative surge voltage is generated, the PN junction diode formed between P type impurity region 62 and N well 61 is rendered conductive, and the current flows from the ground node to the input node 5. P type substrate 10 and N well 61 are biased in the forward direction, a current flows to P type substrate 10, and charges flow into P type substrate 10 through N well 61 and N type buried layer 60. The charges (electrons e) are absorbed by N type buried layer 40 formed in memory cell array region I. If N type buried layer 40 is not provided, the injected charges are absorbed by N type impurity region 43 constituting the capacitor of a memory cell, destroying the data stored therein (H level data is converted to L level data). Destruction of stored data caused by the charges injected to the substrate (soft error) is prevented by the N type buried layer 40.

When radioactive ray from the package is incident on memory cell array region I because of cosmic ray irradiation, for example, electron/hole pairs are generated in P well 41 by the radioactive ray (for example, α ray). The generated holes have short diffusion distance and are absorbed by P well 41 biased to the level of the ground voltage. When N type buried layer 40 were not provided, the generated electrons are absorbed by N type impurity region 43 which will be the storage node of the memory cell (electrode node of memory cell capacitor), and the data stored in the memory cell would be destroyed in the similar manner. The electrons (e) generated by the incident radioactive ray in P well 41 are absorbed by N type buried layer 40 biased to the level of the power supply voltage Vcc. Therefore, in common CMOS memory with a dynamic memory cell, N type buried layer 40 is provided below P well 41 in order to prevent soft error. In the same step of manufacturing process as N type buried layer 40 which is formed in memory cell array region I in the CMOS manufacturing process, N type buried layer 60 is also formed for surge voltage absorbing diode D2. N type buried layers 60 and 40 have at least the same impurity concentration. Similarly, for the inter power supply surge voltage through elements 30 and 31 shown in FIGS. 5 and 6, N type buried layers 35 and 35s are formed in the same step of CMOS manufacturing process as in memory cell array region I. In this manner, it is possible to form N type buried layers for surge resistance enhancing elements to reduce resistance value of the parasitic serial resistance component, without increasing the number of process steps.

As described above, according to the first embodiment of the present invention, an element transmitting the surge voltage between power sources is provided by the P type impurity region, the N well and the N type buried layer formed therebelow, the resistance value of the parasitic serial resistance of the PN junction diode can be reduced and hence the surge voltage can be transmitted at high speed to the internal circuit power source line, and the surge voltage can surely be absorbed.

Second Embodiment

Figure 8:
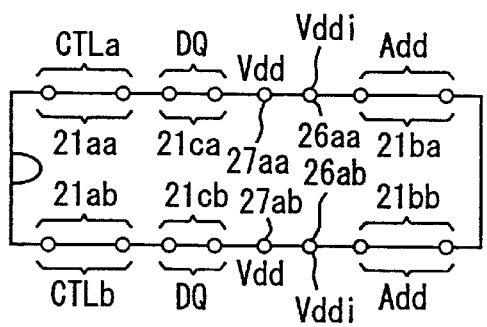
FIG. 8 is a schematic diagram representing pin arrangement of the semiconductor circuit device in accordance with the present invention.

FIG. 8 is a schematic representation of an exemplary pin arrangement of the semiconductor circuit device to which the present invention is applied. Referring to FIG. 8, the semiconductor circuit device is a semiconductor memory device, and to pin terminals 21aa and 21ab, control signals CTLa and CTLb are applied. Input/output data DQ are applied to pin terminals 21ca and 21cb. Internal circuit power supply voltage Vdd is applied to pin terminals 27aa and. 27ab, and input circuit power supply voltage Vddi is applied to pin terminals 26aa and 26ab. Address signal bits Add are applied to pin terminals 21ba and 21bb. Though the ground voltages Vss and Vssi are not shown in FIG. 8, the ground voltages are dispersed and supplied in the similar manner as power supply voltages Vdd and Vddi.

As can be seen from FIG. 8, in the semiconductor circuit device, pin terminals are arranged dispersed in the periphery of the package. Therefore, internal circuit devices are arranged dispersed on the semiconductor chip, depending on the pin arrangement.

Figure 9:
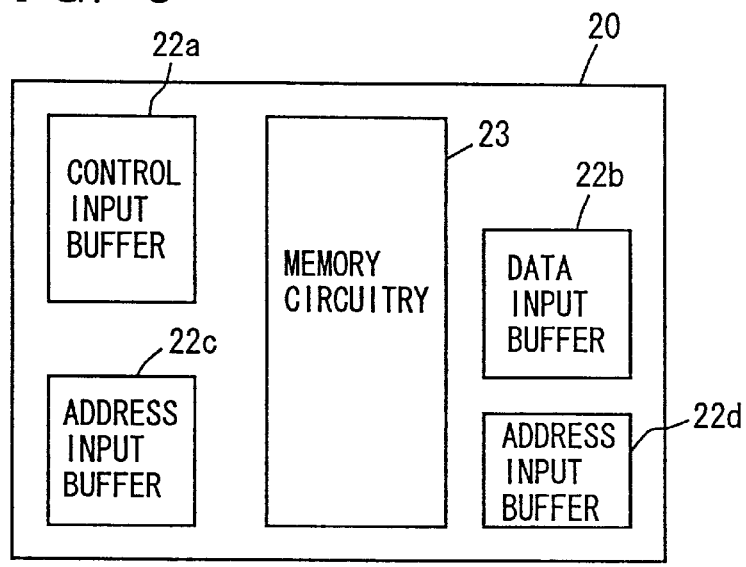
FIG. 9 is a schematic diagram representing arrangement of internal circuitry of the semiconductor circuit device in accordance with the present invention.

FIG. 9 is a schematic representation of an exemplary arrangement of the input circuit in the semiconductor circuit device. Referring to FIG. 9, semiconductor circuit device 20 includes, as input circuitry 22, a control input buffer 22a receiving control signals CTLa and CTLb, address input buffers 22c and 22d receiving address signal bit Add, and a data input buffer 22b receiving input data signal D. Data input buffer 22b and address input buffer 22d are arranged opposing to control input buffer 22a and address input buffer 22c with respect to memory circuitry 23.

As can be seen from FIG. 9, in accordance with the pin arrangement, input circuits (input buffers) are arranged dispersed in the semiconductor circuit device 20. The dispersedly arranged input buffers each include an input buffer circuit for each input signal, and an input protection circuit is provided for each input buffer circuit.

Figure 10:
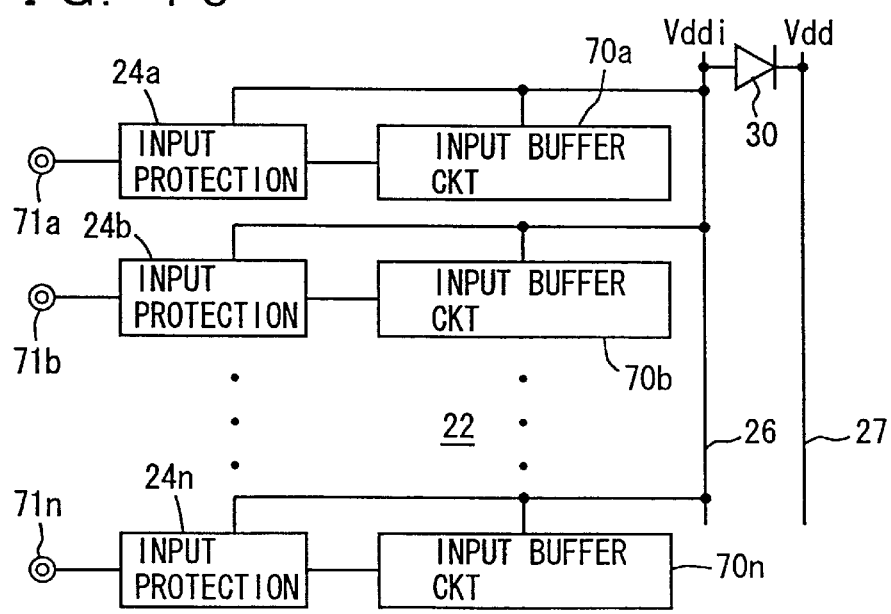
FIG. 10 is a schematic diagram representing power supply arrangement for an input buffer in accordance with the present invention.

FIG. 10 represents an exemplary arrangement of surge resistance enhancing element in accordance with the second embodiment of the present invention. Referring to FIG. 10, input protection circuits 24a–24n are provided for input pads 71a to 71n, respectively, and input buffer circuits 70a to 70n are arranged for input protection circuit 24a to 24n, respectively. Input buffer circuits 70a to 70n are included in input circuitry 22 shown in FIG. 4, and input buffer circuits 70a to 70n are arranged dispersed, as shown in FIG. 9. Input protection circuits 24a to 24n and input buffer circuits 70a to 70n are commonly coupled to power supply line 26 and receive input circuit power supply voltage Vddi. Power supply line 26 is coupled to power supply line 27 through surge resistance enhancing element 30. The surge voltage generates in any of input pads 71a to 71n. Input buffer circuits 70a to 70n are arranged dispersed on the semiconductor chip, as shown in FIG. 9.

When power supply line 26 becomes long with its line resistance becoming innegligible, it may be impossible to efficiently absorb the surge voltage. When power supply lines 26 and 27 are arranged not parallel to each other over a long distance because of the arrangement of memory circuit 26 and input circuitry 22, it is impossible to efficiently arrange the surge resistance enhancing element 30. The second embodiment of the present invention enables an efficient arrangement of surge resistance enhancing element 30 and an arrangement capable of efficiently absorbing the surge voltage no matter which input pad has the surge voltage generate of thereat.

Figure 11:
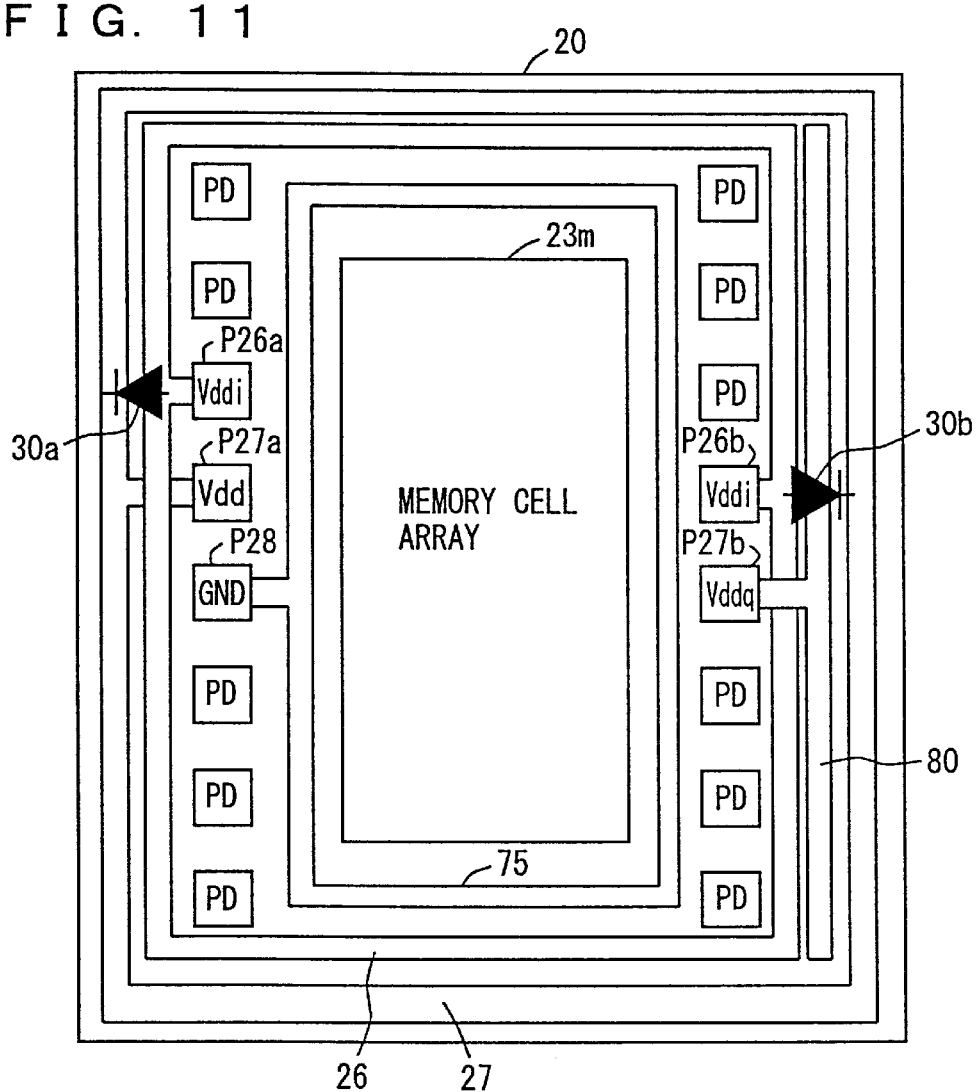
FIG. 11 is a schematic diagram representing configurations of main portions of the semiconductor circuit device in accordance with the second embodiment of the present invention.

FIG. 11 is a schematic representation of a main portion of semiconductor circuit device 20 in accordance with the second embodiment of the present invention. Referring to FIG. 11, semiconductor circuit device 20 is formed on a rectangular semiconductor chip (substrate). Semiconductor circuit device 20 includes a memory cell array 23m as memory circuitry. Outside memory cell array 23m, external signal input pads PD are arranged along the chip periphery. In alignment with external signal input pads PD, arranged are a power supply pad p26a receiving power supply voltage Vddi, a power supply pad p27a receiving internal circuit power supply voltage Vdd, a ground pad p28 receiving the ground voltage GND, a power supply pad p26b receiving input circuit power supply voltage Vddi, and a power supply pad p27b receiving output circuit power supply voltage Vddq. The output circuit power supply voltage Vddq will be described in detail later. The output circuit is required of high speed driving of a large external load, and hence the output circuit has large consumption current and causes much fluctuation of the power supply voltage. Therefore, in order that the operation of the output circuit does not affect other circuits, output circuit power supply voltage Vddq is transmitted only for the output circuit, through pad p27b.

Pads 26a and 26b receiving input circuit power supply voltage Vddi are provided on opposing sides of memory cell array 23m, in order to supply internal circuit power supply voltage Vddi stably, as input buffer circuits are arranged dispersed on the semiconductor chip, as shown in FIG. 9. voltage through diodes 30a and 30b may be provided, arranged dispersed over semiconductor chip 20.

As can be seen from FIG. 11, as inter power supply surge voltage through diodes 30a and 30b are arranged dispersed on semiconductor chip 20, it is possible to transmit the surge voltage to power supply line 27 without any influence of line resistance of power supply line 26, and hence the generated surge voltage can be transmitted at high speed to power supply line 27 regardless of where the surge voltage is generated. Therefore, surge resistance is made less dependent on the location where the surge voltage is generated.

In the configuration shown in FIG. 11, there are two pads provided to receive input power supply voltage Vdd. Even when there is one pad to receive power supply voltage Vdd, similar effect can be obtained by arranging power supply line 26 in the shape of a closed loop and by arranging a plurality of surge voltage through diodes dispersed on the semiconductor chip.

The input buffer circuit is arranged close to an external signal input pad PD.

When power supply lines 26 and 27 are arranged in closed loops, power supply lines 26 and 27 intersect near power supply pad 27a. Crossing of the power supply lines can readily be attained by forming power supply lines 26 and 27 in different interconnection layers at this intersecting portion.

Modification

Figure 12:
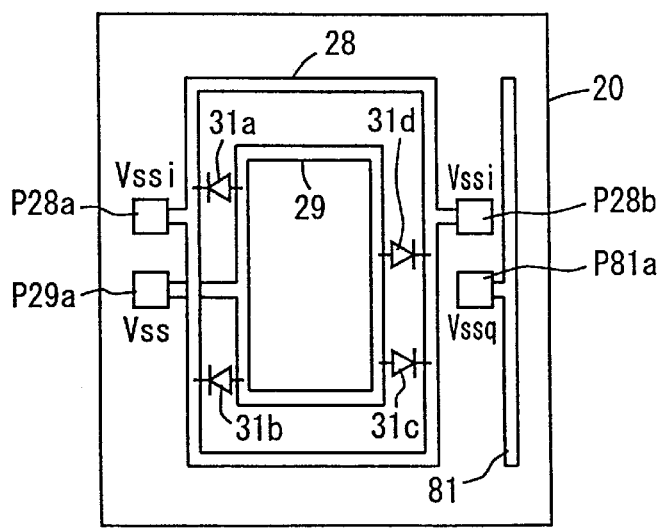
FIG. 12 is an illustration representing a modification of the second embodiment of the present invention.

FIG. 12 is a schematic representation of a configuration of a modification of the second embodiment. In the arrangement shown in FIG. 12, pads p28a and p28b receiving input circuit ground voltage Vssi are arranged on opposing sides in the periphery of semiconductor chip 20. Ground line 28 is arranged extending continuously in the shape of a closed loop and connected to pads p28a and p28b.

A pad p27a receiving internal circuit ground voltage Vss is connected to ground line 29 which is also in the shape of a similar closed loop.

A power supply line (ground line) 81 is provided for a pad p81a

The power supply line 26 from power supply pads p26a and p26b is arranged continuously extending in the shape of a closed loop along the peripheral portion of the semiconductor chip 20 on which the semiconductor circuit device 20 is formed (hereinafter simply referred to as semiconductor chip 20). Therefore, power supply voltage Vddi is transmitted in two directions from power supply pads p26a and p26b through the power supply line 26 in the shape of a closed loop. In one input buffer circuit, power supply voltage Vddi is supplied from opposing sides, through power supply line 26, and therefore the power supply is enhanced.

Power supply line 27 connected to power supply pad p27a is also arranged continuously extending in the shape of a closed loop along the periphery of semiconductor chip 20. As power supply line 27 is arranged to form a closed loop, it becomes possible to supply the power supply voltage utilizing a power supply lead, regardless of the distance from power supply pad p27a, to the internal circuitry. Therefore, equivalently, the power supply line length between the power supply line and the internal circuitry can be made shorter, and hence internal circuit power supply voltage Vdd can be supplied to the internal circuitry (including memory cell array 23m) stably.

Further, ground line 75 from ground pad p28 is similarly arranged continuously extending in the shape of a closed loop, outside the memory cell array 23m. The ground voltage GND on ground pad p28 may be the ground voltage for the internal circuitry, the ground voltage for input circuit, or the ground voltage for an output circuit. Power supply pad p27b is connected to a power supply line 80 arranged extending along one side of semiconductor chip 20. This is because a layout in which output buffer circuits are arranged on one side of semiconductor chip 20 is assumed. If output circuits are provided on opposing sides of the chip, power supply pads p27b would be arranged on opposing sides of memory cell array 23m.

Surge resistance enhancing element 30 includes inter power supply surge voltage through diodes 30a and 30b connected between power supply lines 26 and 27. Diodes 30a and 30b are arranged on opposing sides of memory cell array 23m. Larger number of inter power supply surge receiving output circuit ground voltage Vssq. The power supply line 81 is arranged corresponding to the output circuits, along one side in the periphery of semiconductor chip 20.

Between ground lines 28 and 29, inter power supply surge voltage through diodes 31a to 31d are arranged dispersed as surge resistance enhancing elements 31. The diodes 31a to 31d cause a current to flow from ground line 29 to ground line 28 when conduct. Accordingly, even when the negative surge voltage is generated, the negative surge voltage can be transmitted at high speed from the ground line 28 to ground line 29 to be absorbed by the ground line 29, regardless of the location where the negative surge voltage generates. Accordingly, the surge resistance can be made less dependent on the location for the negative surge voltage as well. Thus a semiconductor circuit device having superior surge resistance is realized.

As inter power supply surge voltage through diodes 31a to 31d are arranged dispersed on semiconductor chip 20, there is little influence of line resistance on ground line 28, and the negative surge voltage can be transmitted to ground line 29 through diodes 31a to 31d near a portion where the surge voltage generates.

The arrangement of diodes constituting surge resistance enhancing elements 30 and 31 shown in FIGS. 11 and 12 has the following advantages.

Figure 13:
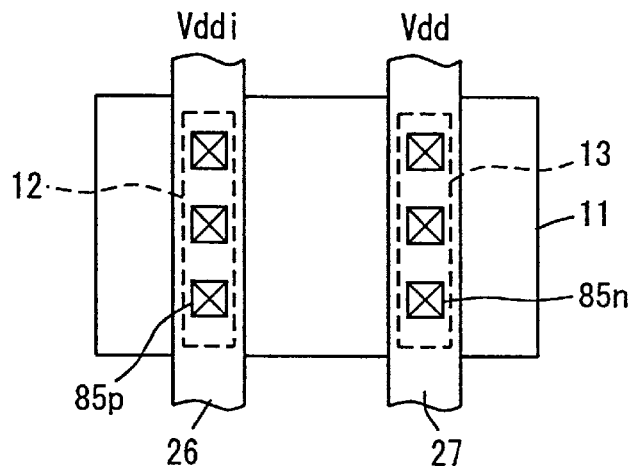
FIG. 13 is a schematic illustration of a planar layout of the surge resistance enhancing element in accordance with the second embodiment of the present invention.

FIG. 13 is a schematic representation of a planar layout of diodes included in surge resistance enhancing element 30.

Power supply lines 26 and 27 are arranged parallel to each other. An N well 11 is provided below power supply lines 26 and 27. At the surface of N well 11, p type impurity region 12 and N type impurity region 13 are formed. P type impurity region 12 is connected to power supply line 26 through a contact hole 85p, and N type impurity region 13 is connected to power supply line 27 through a contact hole 85n. Therefore, it is possible to arrange the diodes overlapped with power supply lines 26 and 27 when viewed two-dimensionally, so that the layout of the surge enhancing elements can be simplified. Further, power supply lines 26 and 27 are provided extending parallel to each other, so that the width of N well 11 along the direction of extension of the power supply lines 26 and 27 can be made sufficiently wide, the current drivability of the diodes can be made sufficiently large, and therefore the surge voltage can be transmitted at high speed.

FIG. 13 schematically shows the layout of the surge voltage through diodes. Generally, power supply lines 26 and 27 are formed in the second or third level interconnection layer, and it is necessary to provide a first level interconnection layer inserted above the surface of N well 11 formed at the surface of the semiconductor substrate, and to provide a contact by means of a plug, for example. The specific electrical connection between power supply lines 26 and 27 and impurity regions 12 and 13 are not specifically significant. What is important is that the region where power supply lines 26 and 27 are arranged is overlapped with the surge through diodes.

As regards diode elements 31a to 31d for transmitting the negative surge voltage, similar layout to the arrangement of FIG. 13 can be implemented. This is because the ground lines 28 and 29 are arranged extending parallel to each other over a long distance.

In the pad arrangement shown in FIG. 11, pads PD are arranged in the periphery of semiconductor chip 20. Even in the lead on chip (LOC) arrangement in which pads are arranged at the central portion of the semiconductor circuit device, similar effects can be obtained by arranging the power supply lines/ground lines in the shape of loops.

Third Embodiment

Figure 14:
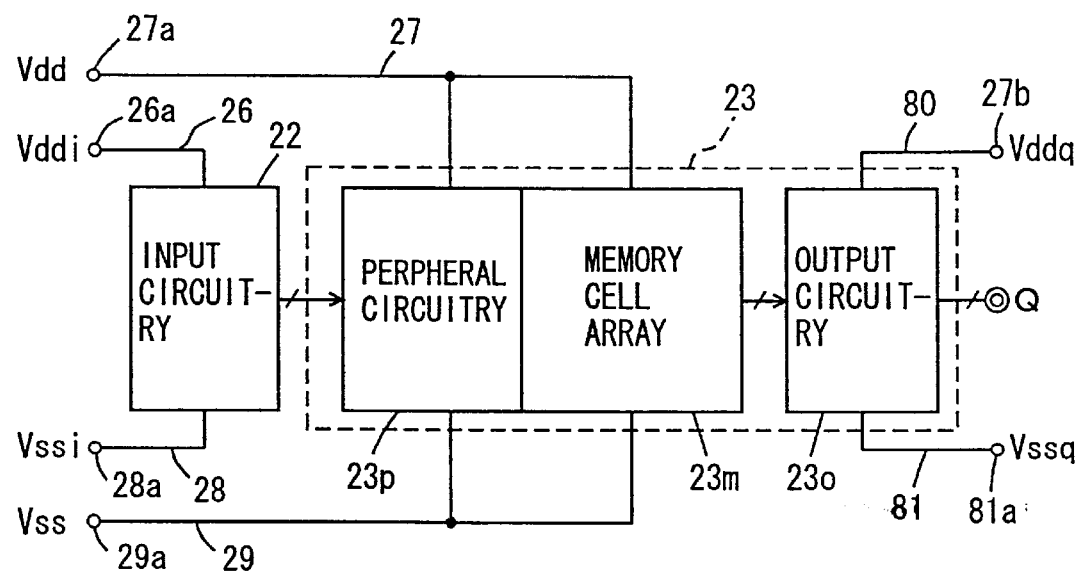
FIG. 14 is a schematic diagram representing a configuration of a memory circuit in accordance with a third embodiment of the present invention.

FIG. 14 more schematically represents the configuration of memory circuitry 23. Referring to FIG. 14, memory circuitry 23 includes peripheral circuitry 23p performing a memory cell selecting operation in accordance with an internal signal from input circuitry 22, a memory cell array 23m including a plurality of memory cells, and output circuitry 23o for externally outputting data of a selected memory cell of memory cell array 23m. In memory cell array 23m, there are provided a plurality of memory cells arranged in a matrix of rows and columns, a bit line equalize circuit for equalizing bit lines arranged corresponding to each column of memory cells to an intermediate voltage, and a sense amplifier circuit for sensing and amplifying memory cell data read onto each column. Peripheral circuitry 23p includes a circuit for controlling the memory cell selecting operation in accordance with the internal signal from input circuitry 22, as well as an address signal decode circuit, a control signal generating circuit, a data write circuit and a data read circuit.

To input circuitry 22, power supply voltage Vddi is applied through power supply line 26 from input node (pad) 26a, and the ground voltage Vssi is applied through ground line 28 from input node (pad) 28a. In memory circuitry 23, to peripheral circuitry 23p and memory cell array 23m, power supply voltage Vdd applied to input node (pad) 27a is applied through power supply line 27, and the ground voltage Vss applied to the input node (pad) is applied through ground line 29.

To output circuitry 23o, output power supply voltage Vddq applied at input node (pad) 27b is applied through power supply line 80, and the ground voltage Vssq applied to input node (ad) 81a is applied through ground line 81.

To the input circuitry 22, power supply voltage Vddi is applied dedicatedly for the input circuitry in order to determine high level/low level of an external input signal.

To peripheral circuitry 23p and memory cell array 23m, power supply voltage Vdd and ground voltage Vss are applied. Separate power supply voltages Vddp and Vdds for peripheral circuitry 23p and memory cell array 23m may be generated using an internal power supply voltage down converting circuit, from power supply voltage Vdd.

The power supply voltage Vddq and the ground voltage Vssq are provided dedicatedly for output circuitry 23o, from the following reasons.

Figure 15:
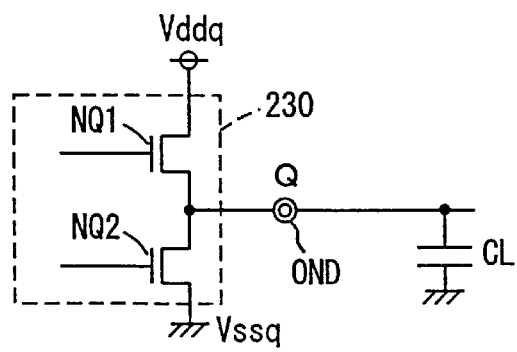
FIG. 15 is a schematic diagram representing a configuration of a final output stage of the output circuit shown in FIG. 14.

FIG. 15 is a schematic representation of the configuration of the final output stage of output circuitry 23o shown in FIG. 14. The final stage of output circuitry 23a includes n channel MOS transistors NQ1 and NQ2 connected in series between the power supply node and the ground node. In a data output operation, one of MOS transistors NQ1 and NQ2 is turned on, an H level signal which is at the level of the power supply voltage Vddq or a signal at the level of the ground voltage Vssq is output externally through output node OND.

An external signal line and an input capacitance are connected to output node OND. Load capacitance CL of output node OND is relatively large, because of interconnection lines outside the chip, for example. It is necessary for output circuitry 23o to charge and discharge output load CL at high speed. Therefore, the size (channel width) of MOS transistors NQ1 and NQ2 at the final output stage is made as large as about several hundreds $\mu$m, for example, and MOS transistors NQ1 and NQ2 drive the load CL with large current drivability. When output load CL is driven through output node OND, power supply voltage Vddq or the ground voltage Vssq is consumed by the driving current. When the power supply voltage Vddq is consumed with the large current drivability, it is possible that the voltage level of output power supply voltage Vddq lowers, and power supply noise is generated, while large current flows into ground voltage Vssq increasing the voltage level thereof, and power supply noise is similarly generated. In order that the power supply noises on voltages Vddq and Vssq do not affect other circuits, power supply voltages Vddq and Vssq are applied exclusively to output circuitry 23o. Here, it is especially noted that when the number of output data bits of output circuitry 23o is large and the number of output circuits is large, much current is consumed in operation, resulting in considerable magnitudes of fluctuation of power supply voltage Vddq/Vssq. Therefore, there is much influence of the power supply voltage. For this reason, a configuration is generally utilized that the power supply voltages Vddq/Vssq is supplied from the outside for every prescribed number of bits of the output circuitry. Therefore, in most cases, there are a plurality of input nodes 27b receiving the power supply voltage Vddq and a plurality of input nodes 81a receiving the ground voltage Vssq, in the semiconductor circuit device.

In peripheral circuitry 23p and memory cell array 23m, only a part of the overall circuitry operates to reduce current consumption. More specifically, memory cell array 23m is divided into blocks and operation is performed block by block. Therefore, even when the number of components of peripheral circuitry 23p and memory cell array 23m is large, the number of components operating at one time is small, and hence power supply voltage Vdd does not much fluctuate (current consumption is small when peripheral circuitry 23p and memory cell array 23m operate). Specially in the peripheral circuitry 23p and memory cell array 23m, the transistor size is reduced in view of higher degree of integration. Namely, the transistor size (channel width) is several to several tens μm, the transistor has small current drivability and hence small current consumption, so that power supply voltage Vdd and the ground voltage Vss fluctuates only a little.

Figure 16:
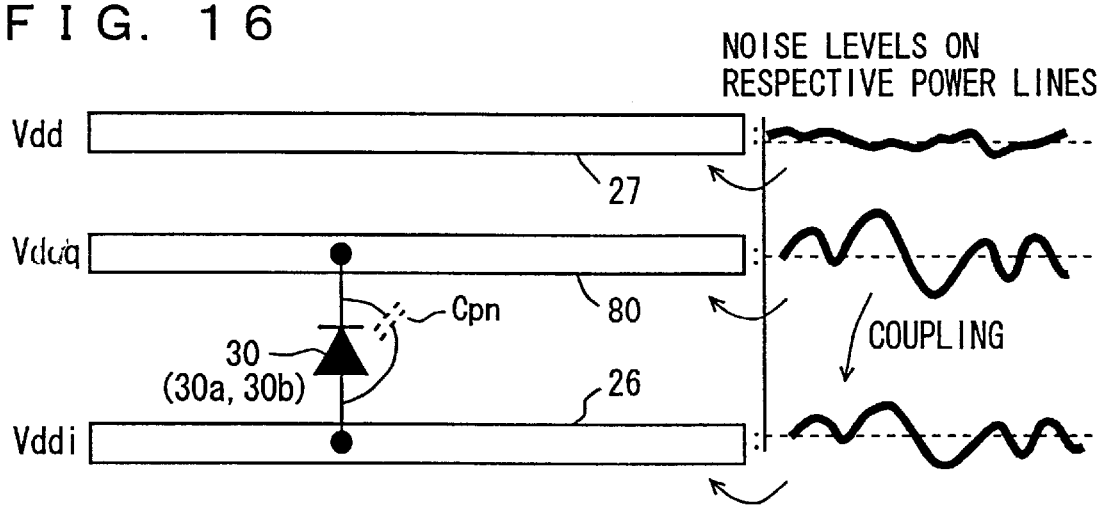
FIG. 16 represents an exemplary connection of inter power supply surge voltage through diode.

Assume that surge resistance enhancing element 30 (diodes 30a and 30b) is connected between power supply lines 80 and 26 as shown in FIG. 16. In the element 30, junction capacitance Cpn of the PN junction is connected as a parasitic capacitance between power supply lines 80 and 26. Power supply voltage Vddq on power supply line 80 considerably fluctuates because of current consumption by the output circuitry, in a data output operation. The power supply noise on power supply voltage Vddq is transmitted by the capacitive coupling through PN junction parasitic capacitance Cpn to power supply line 26. Power supply voltage Vddi on power supply line 26 must be stabilized in order to allow accurate determination of H level/L level of the input signal, and if stable determining operation is impossible because of the noise, malfunction is possible at the time of data outputs.

Figure 17:
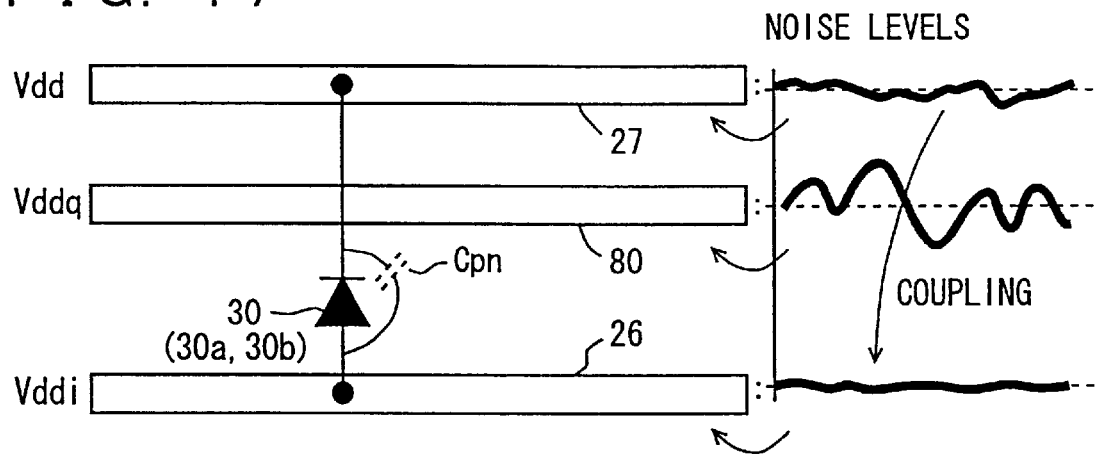
FIG. 17 represents connection of the surge resistance enhancing element in accordance with the third embodiment of the present invention.

Accordingly, as can be seen from FIGS. 17 and 11, surge resistance enhancing element 30 (diodes 30a, 30b) is connected between power supply line 27 transmitting internal power supply voltage Vdd and power supply line 26. As described above, power supply voltage Vdd on power supply line 27 does not much fluctuate even when the internal circuitry is in operation. Therefore, even when there is a capacitive coupling through PN junction parasitic capacitance Cpn between power supply lines 27 and 26, it is possible to stably hold the voltage level of input power supply voltage Vdd when the memory cell array and the peripheral circuitry are in operation, and malfunction can be prevented, as power supply voltage Vdd does not much fluctuate. Accordingly, even when the surge resistance enhancing element for the input protection circuit is provided, the input circuitry can operate stably without any influence of the operation of the output circuitry.

Figure 18:
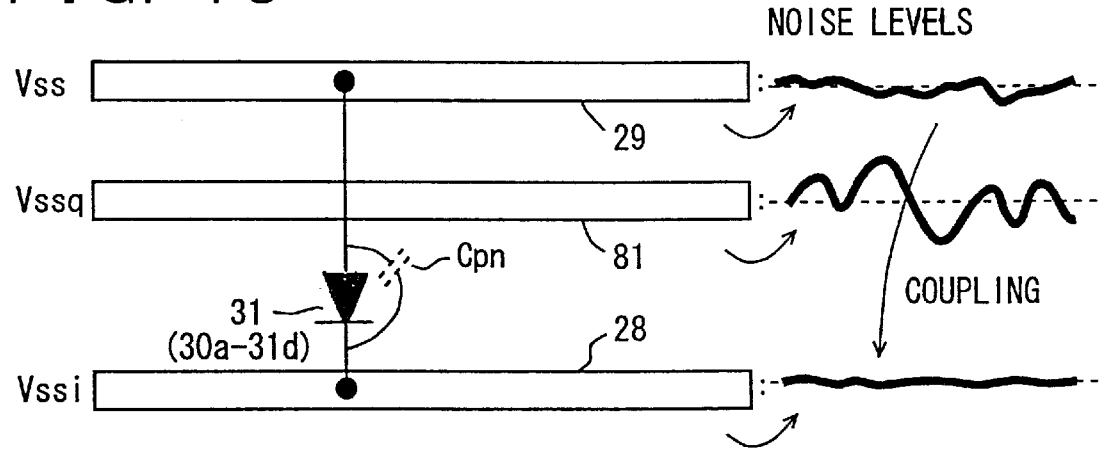
FIG. 18 represents a modification of the third embodiment of the present invention.

FIG. 18 shows a configuration of a modification of the third embodiment in accordance with the present invention. In the configuration shown in FIG. 18, surge resistance enhancing element 31 (diodes 31a–31d) is connected between ground line 29 transmitting internal circuit ground voltage Vss and ground line 28 transmitting input circuitry ground voltage Vssi. In this connection arrangement also, ground line 29 is coupled only to memory cell array 23m and peripheral circuitry 23p, and ground voltage Vss does not fluctuate much. Therefore, even when there is the PN junction parasitic capacitance Cpn of element 31, input circuitry ground voltage Vssi is stably held at a constant voltage level. Accordingly, even when the surge resistance enhancing element is used in a multi-power source configuration, the input circuitry can operate stably, and the feature of the multi-power source configuration is maintained.

As described above, according to the third embodiment of the present invention, the surge resistance enhancing element is connected between a power supply line (Vdd/Vss) connected to circuitry (peripheral circuitry and memory cell array) consuming only a small current in operation and an input circuit power supply line (Vddi/Vssi), it is possible to hold the input circuit power supply voltage stably at a constant voltage level. Therefore, it is possible to operate the input circuitry of the semiconductor circuit device stably without any influence of an operation of the output circuitry which consumes much current in operation to cause much fluctuation in power supply voltage Vddq/Vssq.

Fourth Embodiment

Figure 1:
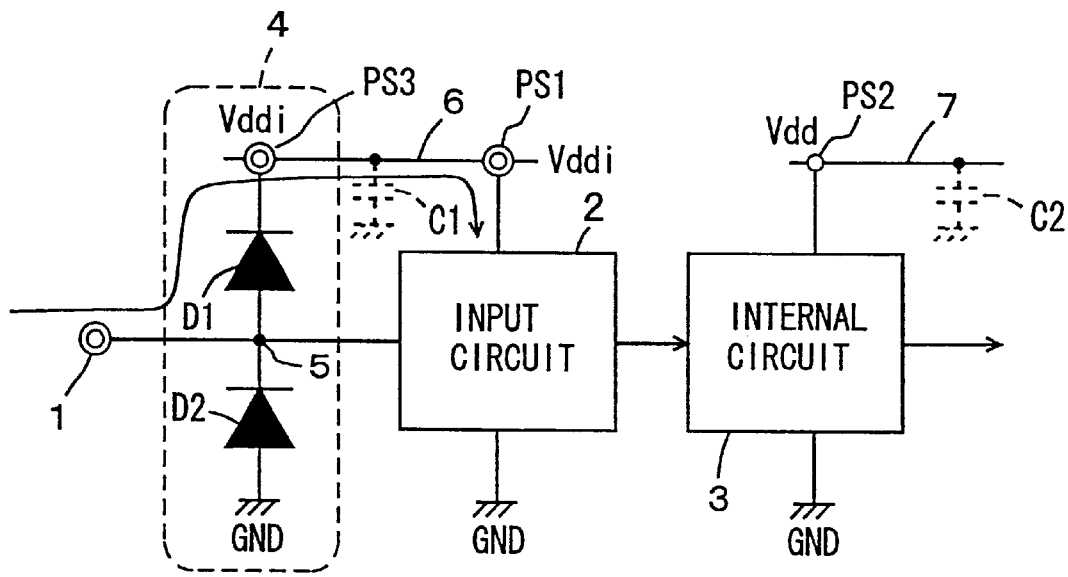
FIG. 1 is a diagram representing a configuration of an input protection circuit.
Figure 2:
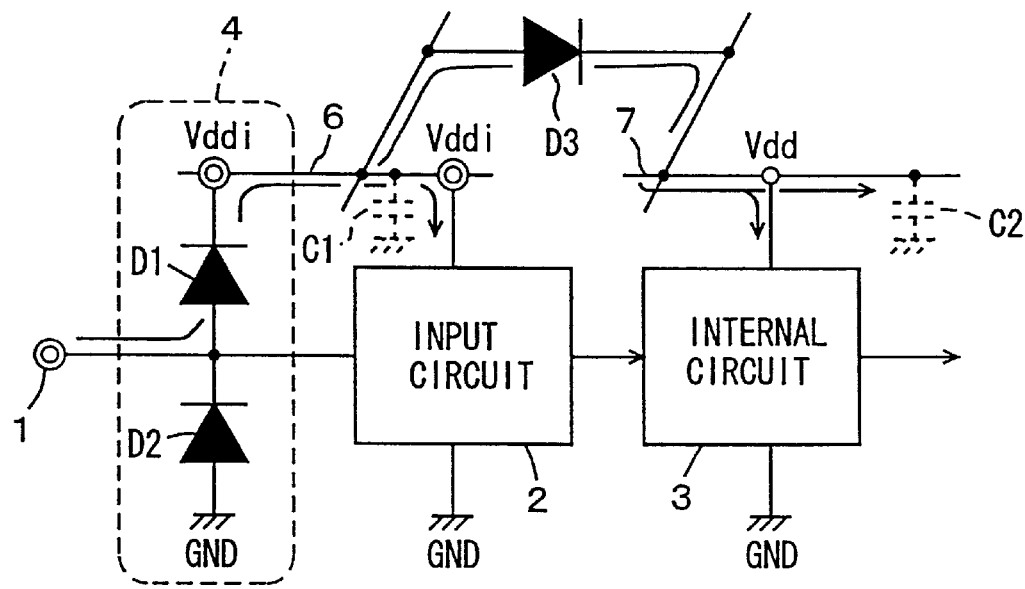
FIG. 2 is a diagram representing a configuration of another conventional input protection circuit.
Figure 3:
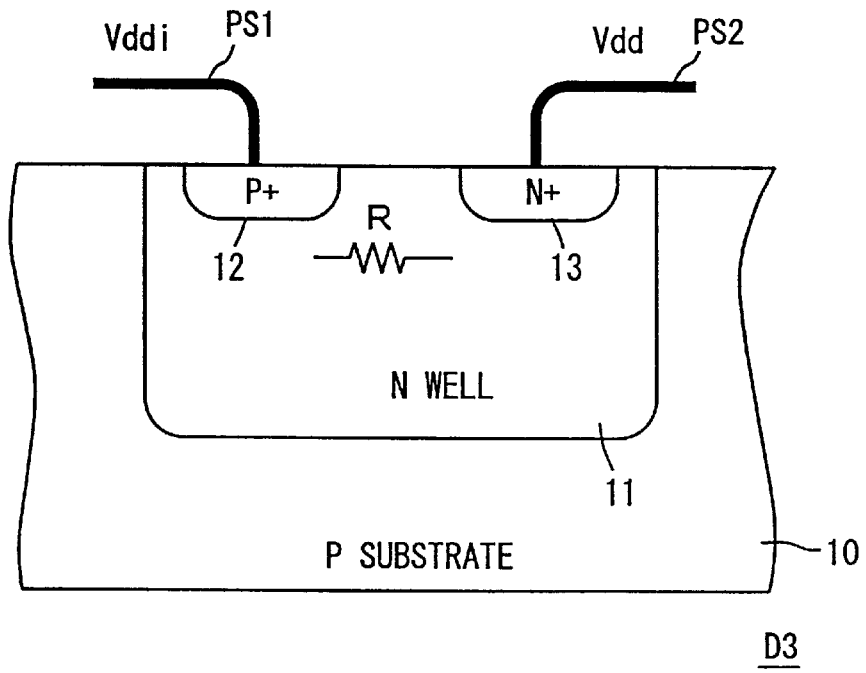
FIG. 3 is a schematic diagram representing a cross sectional structure of a surge absorbing diode included in the conventional input protection circuit.
Figure 19:
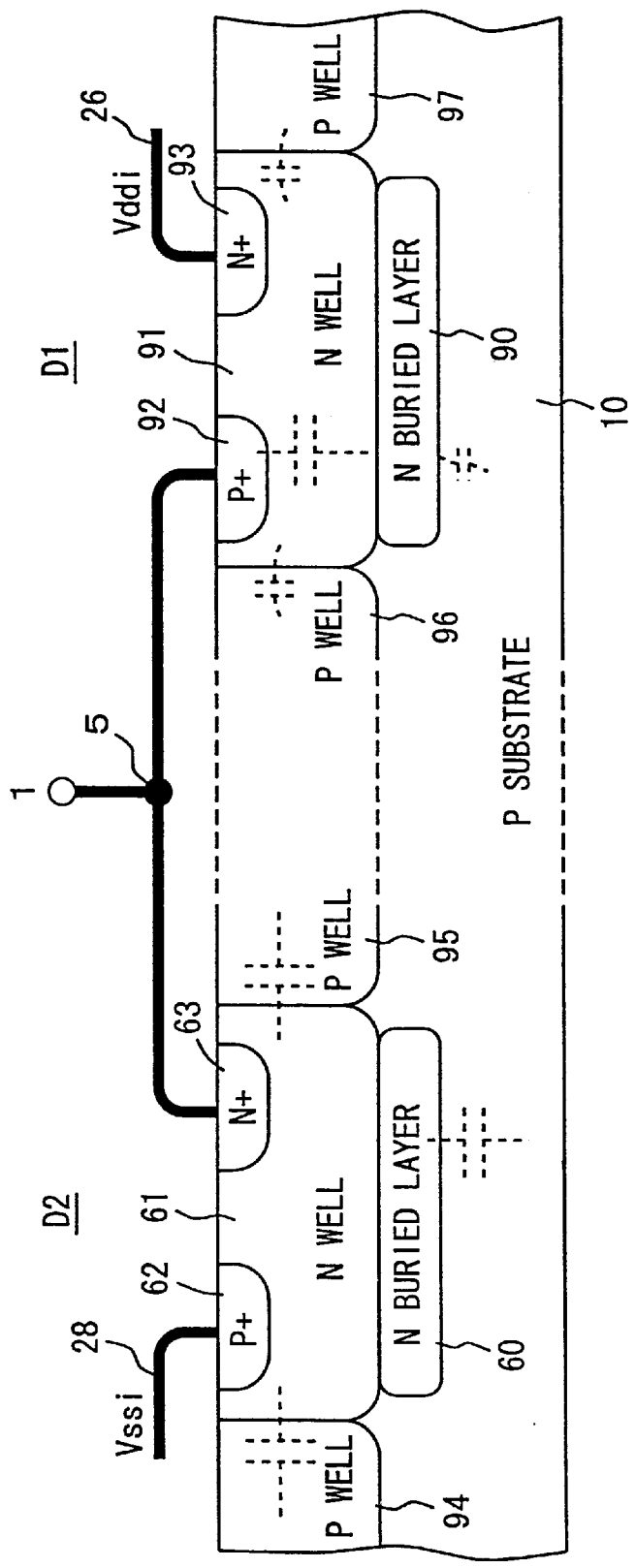
FIG. 19 is a schematic diagram representing a cross sectional structure of the input protection circuit in accordance with the fourth embodiment of the present invention.

FIG. 19 schematically shows a structure of the input protection circuit in accordance with the fourth embodiment of the present invention. The input protection circuit shown in FIG. 19 corresponds to input protection circuits 24a to 24n shown in FIG. 10, and represents an input protection circuit provided corresponding to one input buffer circuit. An electrical equivalent circuit of the input protection circuit is the same as that of the conventional input protection circuit of FIGS. 1 and 2, and includes diodes D1 and D2.

Referring to FIG. 19, the positive surge voltage absorbing diode D1 included in input protection circuit 24 (24a–24n) includes an N type buried layer 90 formed in P type semiconductor substrate 10, an N type well 91 formed on N type buried layer 90, a high concentration P type impurity region 92 formed at the surface of N type well 91, and a high concentration N type impurity region 93 formed at N type well 91 apart from P type impurity region 92. The surface of N type buried layer 90 is in contact with the bottom portion of N type well 91. The N type buried layer 90 lowers well resistance of N type well 91, as in the first embodiment described previously. N type impurity region 93 is connected to power supply line 26 transmitting power supply voltage Vddi. P type impurity region 92 is electrically connected to input node (pad) 1 through an internal node 5. P type wells 96 and 97 are formed in contact with N type well 91 on opposing sides of N type well 91.

A negative surge voltage absorbing diode D2 has similar structure as diode D2 shown in FIG. 7, and includes an N type buried layer 60, an N type well 61 formed on N type buried layer 60, and high concentration impurity regions 62 and 63 formed at the surface of N type well 61. P type wells 94 and 95 are formed in contact with the N type well 61 on opposing sides of N type well 61. N type impurity region 63 is electrically connected to input node (pad) 1 through an internal node 5. P type impurity region 62 is electrically connected to ground line 28 transmitting ground voltage Vssi. The surface of N type buried layer 60 is in contact with the bottom portion of N well 61. P wells 95 and 96 may be one P type well, or separate well regions.

In this arrangement, PN junction capacitance is formed between N type well 91 and P wells 96 and 97 on opposing sides of diode D1. Further, a PN junction capacitance (represented by a dotted line) is formed between P type impurity region 92 and N well 91. Similarly, parasitic capacitance is formed between N type buried layer 90 and P type substrate 10.

In diode D2, PN junction parasitic capacitance is formed by P wells 94 and 95 on opposite sides of N type well 61, and in addition, parasitic capacitance is formed between N type buried layer 60 and P type substrate 10. Similarly, PN junction parasitic capacitance is formed between P type impurity region 62 and N type well 61. Therefore, there are a large number of parasitic capacitances in diodes D1 and D2, and the surface voltage can be absorbed by the parasitic capacitances when the surge voltage is transmitted through diodes D1 and D2. Therefore, it becomes possible to absorb the surge voltage without additionally providing extra capacitance elements between power supply line 26 and ground line 28.

As described above, according to the fourth embodiment of the present invention, the negative surge voltage discharging diode element is also formed by the P type impurity region and the N type well, with the N well surrounded by a P well. Therefore, parasitic capacitance at the input node can be increased and the negative surge voltage can efficiently be absorbed.

OTHER APPLICATIONS

In the foregoing description, the semiconductor circuit device has been described as a CMOS memory device, especially as a DRAM (Dynamic Random Access Memory). The present invention is similarly applicable to a semiconductor circuit device having multi-power source configuration with input protection circuitry.

As described above, according to the present invention, a semiconductor circuit device capable of efficiently absorbing surge voltage without increasing area, which has superior area efficiency and superior surge resistance, can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device, comprising:
   a first power source line arranged extending continuously in a shape of a loop along a periphery of a semiconductor rectangular region, transmitting a first power source voltage;
   input circuitry coupled to said first power source line and generating an internal signal in accordance with a signal applied to an input node;
   a second power source line arranged separate from said first power source line, continuously extending in a shape of a loop along the periphery of said semiconductor rectangular region and transmitting a second power source voltage, said second power source voltage being the same in logic level as said first power source voltage;
   a plurality of diode elements coupled parallel to each other between the first and second power source lines; and
   a first circuit coupled to said second power source line and consuming said second power source voltage in operation.

2. The semiconductor circuit device according to claim 1, wherein said plurality of diode elements are arranged dispersed on said semiconductor rectangular region.

3. The semiconductor circuit device according to claim 1, further comprising:
   a third power source line provided separate from said first and second power source lines and transmitting a third power source voltage; and
   a second circuit having larger current consumption in operation than said first circuit, and consuming the third power source voltage on said third power source line.

4. The semiconductor circuit device according to claim 3, wherein said second circuit includes an output circuit for externally outputting a signal.

5. The semiconductor circuit device according to claim 1, further comprising a surge absorbing element for transmitting a surge voltage generated at said input node to said first power source line.

6. A semiconductor circuit device, comprising,
   a first power source line transmitting a first power source voltage;
   a second power source line provided separate from said first power source line and transmitting a second power source voltage;
   a third power source line provided separate from the first and second power source line and transmitting a third power source voltage;
   input circuitry using the first power source voltage on said first power source line as an operational power supply voltage for operation to generate an internal signal in accordance with a signal applied to an input node;
   first internal circuitry receiving as one operational power supply voltage the second power source voltage on said second power source line, and performing a prescribed internal operation;
   second internal circuitry receiving as one operational power source voltage the third power source voltage on said third power source line and performing a prescribed operation, said second internal circuitry having larger current consumption in operation than current consumption of said first internal circuitry in operation; and
   a diode element coupled between the first and second power source lines.

7. The semiconductor circuit device according to claim 6, wherein said diode element is arranged in plurality in parallel to each other between said first and second power source lines.

8. The semiconductor circuit device according to claim 7, wherein said diode element arranged in plurality is arranged dispersed over said semiconductor chip.

9. The semiconductor circuit device according to claim 6, wherein said semiconductor circuit device is formed on a semiconductor chip, and wherein
   said first and second power source lines are each arranged continuously extending to form a loop along a periphery of said semiconductor chip.

10. The semiconductor circuit device according to claim 6, further comprising a surge absorbing element for transmitting a surge voltage generated at said input node to said first power source line.

11. The semiconductor circuit device according to claim 10, wherein
   said surge absorbing element includes
   a buried layer of a second conductivity type formed in a semiconductor substrate region of a first conductivity type,
   a well of the second conductivity type formed on said buried layer with a bottom portion thereof being in contact with a surface of said buried layer,
   a first impurity region of the second conductivity type formed on a surface of said well, and
   a second impurity region of the first conductivity type formed at the surface of said well apart from said first impurity region, one of the first and second impurity regions being electrically coupled to said input node, an other of said first and second impurity regions being connected to said first power source line,
   said surge absorbing element being rendered conductive when a surge voltage generates at said input node.

12. The semiconductor circuit device according to claim 6, wherein said diode element includes
- a buried layer of a second conductivity type formed in a semiconductor substrate region of a first conductivity type,
- a well of the second conductivity type formed on said buried layer, with a bottom portion of said well being in contact with said buried layer,
- a first impurity region of the first conductivity type formed on a surface of said well, and
- a second impurity region of the second conductivity type formed at the surface of said well apart from said first impurity region, one of the first and second impurity regions being electrically coupled to said first power source line, an other of said first and second impurity regions being electrically connected to said second power source line,
- said diode element being rendered conductive when a surge voltage generates on said first power source line.

13. The semiconductor circuit device according to claim 6, wherein the first to third power source voltages are externally applied separately to the first to third power source lines.

* * * * *